United States Patent
Seevinck (10) Patent No.: US 10,748,309 B2
(45) Date of Patent: Aug. 18, 2020

(54) MAGNETIC RESONANCE IMAGING WITH ENHANCED BONE VISUALIZATION

(71) Applicants: UMC Utrecht Holding B.V., Utrecht (NL); Stichting voor de Technische Wetenschappen, Utrecht (NL)

(72) Inventor: Peter Roland Seevinck, Utrecht (NL)

(73) Assignee: MRIGUIDANCE B.V., Utrecht (NL)

( * ) Notice: Subject to any disclaimer, the term of this patent is extended or adjusted under 35 U.S.C. 154(b) by 100 days.

(21) Appl. No.: 15/516,418

(22) PCT Filed: Oct. 1, 2015

(86) PCT No.: PCT/EP2015/072745
§ 371 (c)(1),
(2) Date: Apr. 3, 2017

(87) PCT Pub. No.: WO2016/050938
PCT Pub. Date: Apr. 7, 2016

(65) Prior Publication Data
US 2018/0232913 A1    Aug. 16, 2018

(30) Foreign Application Priority Data
Oct. 1, 2014    (EP) .................................. 14187359

(51) Int. Cl.
*G06T 11/00* (2006.01)
*G01R 33/48* (2006.01)
(Continued)

(52) U.S. Cl.
CPC ........ *G06T 11/008* (2013.01); *G01R 33/4816* (2013.01); *G01R 33/4824* (2013.01);
(Continued)

(58) Field of Classification Search
CPC .......... G01R 33/4816; G01R 33/56536; G01R 33/5608; G01R 33/50; G01R 33/4824;
(Continued)

(56) References Cited

U.S. PATENT DOCUMENTS 9,618,593 B2 *   4/2017   Seethamraju ...... G01R 33/4816
2007/0255129 A1 * 11/2007   Du .................... G01R 33/4824
                                                    600/410
(Continued)

FOREIGN PATENT DOCUMENTS

WO    2005/026748 A2    3/2005
WO    2007/044527 A1    4/2007
(Continued)

OTHER PUBLICATIONS

Brodsky et al.( "Generalized k-space decomposition with chemical shift correction for non-Cartesian water-fat imaging." Magnetic Resonance in Medicine: An Official Journal of the International Society for Magnetic Resonance in Medicine 59.5 (2008): 1151-1164 (Year: 2008).*
(Continued)

*Primary Examiner* — Pinalben Patel
(74) *Attorney, Agent, or Firm* — Browdy and Neimark, P.L.L.C.

(57) ABSTRACT

A system for bone imaging is disclosed. A processing unit is provided for processing an echo MRI dataset. The processing unit is configured to apply a phase ramp to the radial sampling lines of the complex data according to the radial sampling scheme to obtain a bone-enhanced image dataset, wherein a single phase ramp is applied to a radial sampling line of the sampling scheme, which radial sampling line extends on both sides of an origin defined by the echo time, and wherein the phase ramp is based on an equation. A combining unit is provided for combining the MRI dataset
(Continued)

with the bone-enhanced image dataset to obtain a background suppressed image dataset.

14 Claims, 5 Drawing Sheets

(51) Int. Cl.
| | | |
|---|---|---|
| *G01R 33/565* | (2006.01) | |
| *G06T 7/194* | (2017.01) | |
| *G01R 33/50* | (2006.01) | |
| *G01R 33/56* | (2006.01) | |

(52) U.S. Cl.
CPC ......... *G01R 33/50* (2013.01); *G01R 33/5608* (2013.01); *G01R 33/56536* (2013.01); *G06T 7/194* (2017.01); *G06T 11/005* (2013.01); *G06T 2207/10088* (2013.01); *G06T 2207/20224* (2013.01); *G06T 2207/30008* (2013.01); *G06T 2211/428* (2013.01)

(58) Field of Classification Search
CPC . G06T 2207/20224; G06T 2207/10088; G06T 11/008; G06T 2211/428; G06T 7/194; G06T 2207/30008; G06T 11/005
See application file for complete search history.

(56) References Cited

U.S. PATENT DOCUMENTS

| | | | | |
|---|---|---|---|---|
| 2008/0258727 A1* | 10/2008 | Qian | .................. | G01R 33/4816 324/312 |
| 2011/0175610 A1* | 7/2011 | Griswold | ........... | G01R 33/4824 324/309 |
| 2011/0286649 A1 | 11/2011 | Reisman et al. | | |
| 2011/0288398 A1* | 11/2011 | Park | .................... | G01R 33/4641 600/410 |
| 2012/0076378 A1 | 3/2012 | Keereman et al. | | |
| 2013/0083987 A1 | 4/2013 | Novak et al. | | |
| 2015/0126850 A1* | 5/2015 | Cetingul | ................ | G01R 33/56 600/413 |
| 2015/0192653 A1* | 7/2015 | Sharif | .................... | A61B 5/055 600/420 |
| 2016/0252596 A1* | 9/2016 | Nielsen | ................ | G01R 33/482 324/309 |
| 2016/0334488 A1* | 11/2016 | Bieri | .................. | G01R 33/4824 |
| 2017/0307714 A1* | 10/2017 | Okell | .................... | A61B 5/026 |
| 2018/0149720 A1* | 5/2018 | Zhao | .................. | G01R 33/4818 |
| 2019/0142297 A1* | 5/2019 | Du | ........................ | G16H 30/40 |

FOREIGN PATENT DOCUMENTS

| | | | |
|---|---|---|---|
| WO | 2013/001399 A2 | 1/2013 | |
| WO | WO-2015113870 A1 * | 8/2015 | ......... G01R 33/4826 |

OTHER PUBLICATIONS

Seevinck, P.R., 'MRI-based visualisation of bone tissue'.
De Leeuw et al., "Center-Out Radial Sampling With Off-Resonant Reconstruction for Efficient and Accurate Localization of Punctate and Elongated Paramagnetic Structures", Magnetic Resonance in Medicine, 2012.
De Leeuw et al., "A dual-plane co-RASOR technique for accurate and rapid tracking and position verification of an Ir-192 source for single fraction HDR brachytherapy", Physics in Medicine and Biology, Oct. 21, 2013, pp. 7829-7839, Institute of Physics and Engineering in Medicine.
Eley et al., "Black bone" MRI: a partial flip angle technique for radiation reduction in craniofacial imaging, The British Journal of Radiology, Mar. 2012, pp. 272-278.
Seevinck et al., "Highly Localized Positive Contrast of Small Paramagnetic Objects Using 3D Center-Out Radial Sampling With Off-Resonance Reception", Magnetic Resonance in Medicine, 2011, pp. 146-156.
Stehning et al., "MR-based Attenuation Mapping of the Pelvis Using 3D UTE DIXON at 3T", Proceedings of the International Society for Magnetic Resonance in Medicine, 2013, p. 2811.
Weiger et al., "Direct depiction of bonemicrostructure using MRI with zero echo time", Bone, 2013, pp. 44-47.
Brodsky et al., "Generalized Ic-Space Decomposition with Chemical Shift Correction for Non-Cartesian Water-Fat Imaging", Magnetic Resonance in Medicine, 2008, p. 1151-1164.
De Leeuw et al., "Center-Out Radial Sampling with Off-Resonant Reconstruction for Efficient and Accurate Localization of Punctate and Elongated Paramagnetic Structures", Magnetic Resonance in Medicine, 2013, pp. 1611-1622.
Krug et al., "Ultrasliort Echo Time MRI of Cortical Bone at 1 Tesla Field Strengths A Feasibility Stwdy", Journal of Magnetic Resonance Imaging, 2011, pp. 691-695.
Magland et al., "Low-SAR Trabecular Bone Micro-MRI for use at Ultra-High Field", Proceedings of the International Society for Magnetic Resonance in Medicine, 2009, p. 1948.
Nayak et al., "Automatic Field Map Generation and Off-Resonance Correction for Projection Reconstruction Imaging", Magnetic Resonance in Medicine, 2000, pp. 151-154.

* cited by examiner

MAGNETIC RESONANCE IMAGING WITH ENHANCED BONE VISUALIZATION

FIELD OF THE INVENTION

The invention relates to magnetic resonance imaging. More particularly, the invention relates to bone imaging.

BACKGROUND OF THE INVENTION

In healthcare, the main application of magnetic resonance imaging (MRI) is imaging of soft tissue types, such as white brain matter, gray brain matter, and organs. For three-dimensional bone imaging, computed tomography (CT) remains the gold standard. Attempts to detect and segment bone structures form MRI data have been made. For example, WO 2007/044527 discloses a method comprising detecting and segmenting bone borders using dark bone border intensity information from an MRI image, building a model of a bone using the segmented bone borders and using the model of the bone to detect bone disease, and detecting bone disease within a segmented image region. WO 2013/001399 discloses ultra-short echo time image data comprising bone image data. WO 2013/001399 further discloses ultra-short echo time enabling the imaging of tissue with extremely small free induction decay values such as tendons or bone, and bone image data encompassing magnetic resonance data which contains free induction decay data which is descriptive of the position and location of bone within the subject.

WO 2013/001399 discloses an example of a medical apparatus comprising a magnetic resonance imaging system and a computer system.

However, it would be valuable to be able to provide improved bone visualization based on MRI.

SUMMARY OF THE INVENTION

According to a first aspect, the invention provides a system for bone imaging using magnetic resonance imaging. The system comprises a processing unit for processing an echo MRI dataset, wherein the echo MRI dataset is generated according to an echo time and a radial sampling scheme wherein at least a center of a k-space is sampled in a radial fashion, wherein the echo time is greater than or equal to a predetermined $T_2$ value of a bone, and wherein the echo MRI dataset comprises complex data;

wherein the processing unit is configured to apply a phase ramp to the radial sampling lines of the complex data according to the radial sampling scheme to obtain a bone-enhanced image dataset, wherein a single phase ramp is applied to a radial sampling line of the sampling scheme, which radial sampling line extends on both sides of an origin defined by the echo time, and wherein the phase ramp is based on an equation $$H(k)=e^{-i2\pi f(k)x_0},$$

wherein $H(k)$ is the phase ramp expressed in a complex radial frequency domain with coordinate k, and $x_0$ represents a shift in image space, and $f(k)$ is a monotonically increasing function of k, wherein the processing unit is configured to apply $H(k)$ with positive and negative values of k.

The system may further comprise a combining unit for combining the generated MRI dataset with the bone-enhanced image dataset, to obtain a background suppressed image dataset. The combining unit may help to remove the non-bone structures, using e.g. comparison techniques and/or susceptibility induced phenomena.

According to another aspect of the invention, a method of bone imaging using magnetic resonance imaging is provided. The method comprises processing an echo MRI dataset, wherein the echo MRI dataset is generated according to an echo time and a radial sampling scheme wherein at least a center of a k-space is sampled in a radial fashion, wherein the echo time is greater than or equal to a predetermined $T_2$ value of a bone, and wherein the echo MRI dataset comprises complex data;

wherein the processing comprises applying a phase ramp to the radial sampling lines of the complex data according to the radial sampling scheme to obtain a bone-enhanced image dataset, wherein a single phase ramp is applied to a radial sampling line of the sampling scheme, which radial sampling line extends on both sides of an origin defined by the echo time, and wherein the phase ramp is based on an equation $$H(k)=e^{-i2\pi f(k)x_0},$$

wherein $H(k)$ is the phase ramp expressed in a complex radial frequency domain with coordinate k, and $x_0$ represents a shift in image space, and $f(k)$ is a monotonically increasing function of k; wherein $H(k)$ is applied with positive and negative values of k.

According to another aspect of the invention, a computer program product comprising computer readable instructions is provided. The instructions, when executed by a control unit, cause the control unit to control processing an echo MRI dataset, wherein the echo MRI dataset is generated according to an echo time and a radial sampling scheme wherein at least a center of a k-space is sampled in a radial fashion, wherein the echo time is greater than or equal to a predetermined $T_2$ value of a bone, and wherein the echo MRI dataset comprises complex data; wherein the processing comprises applying a phase ramp to the radial sampling lines of the complex data according to the radial sampling scheme to obtain a bone-enhanced image dataset, wherein a single phase ramp is applied to a radial sampling line of the sampling scheme, which radial sampling line extends on both sides of an origin defined by the echo time, and wherein the phase ramp is based on an equation $$H(k)=e^{-i2\pi f(k)x_0},$$

wherein $H(k)$ is the phase ramp expressed in a complex radial frequency domain with coordinate k, and $x_0$ represents a shift in image space, and $f(k)$ is a monotonically increasing function of k; wherein $H(k)$ is applied with positive and negative values of k.

The person skilled in the art will understand that the features described above may be combined in any way deemed useful. Moreover, modifications and variations described in respect of the system may likewise be applied to the method and to the computer program product, and modifications and variations described in respect of the method may likewise be applied to the system and to the computer program product.

BRIEF DESCRIPTION OF THE DRAWINGS

In the following, aspects of the invention will be elucidated by means of examples, with reference to the drawings. The drawings are diagrammatic and may not be drawn to scale.

DETAILED DESCRIPTION

In the following, aspects are described in more detail to enable a skilled person to carry out the invention. However, the details provided herein are merely presented as examples, and are by no means intended to limit the scope of the invention.

According to a first example, a system for bone imaging comprises an input unit for receiving an echo MRI dataset according to a radial sampling scheme and an echo time greater than or equal to a $T_2$ value of a bone, wherein the MRI dataset comprises complex data indicative of a chemical shift and a magnetic susceptibility; and a processing unit for processing the MRI dataset by applying a phase ramp to the complex data according to the radial sampling scheme, to obtain a bone-enhanced image dataset, wherein the phase ramp is applied to positive and negative positions on a radial sampling line of the sampling scheme with respect to an origin defined by the echo time.

The phase ramp affects, among others, the regions of the image data with bone tissue. By applying the phase ramp, the signal intensity of bone tissue in the image dataset is enhanced. The sampling scheme and echo time allow regions indicative of bone tissue to be captured.

For example, the echo time may locally facilitate signal decay.

According to another example, the invention provides a system for bone imaging using magnetic resonance imaging, comprising an acquisition device for generating an echo MRI dataset according to a radial sampling scheme and an echo time greater than or equal to a $T_2$ value of a bone, wherein the MRI dataset comprises complex data indicative of a chemical shift and a magnetic susceptibility; and a processing unit for processing the MRI dataset by applying a phase ramp to the complex data according to the radial sampling scheme, to obtain a bone-enhanced image dataset.

The phase ramp affects the regions with bone tissue of the image data. By applying the phase ramp, the signal intensity of bone tissues in the image dataset is enhanced. The sampling scheme and echo time help locations indicative of bone tissues to be captured.

The system may further comprise a combining unit for combining the generated MRI dataset with the bone-enhanced image dataset, to obtain a background suppressed image dataset. The combining unit may help to remove the non-bone structures, using e.g. comparison techniques and/or susceptibility induced phenomena.

The acquisition device may be configured to sample, for a particular gradient setting, data on both sides of an origin of k-space according to the echo time (TE). This allows relatively high signal to noise ratio (SNR) and quick data collection. Moreover, it may allow efficient and fast data processing on single k-lines to facilitate sliding window processing and image reconstructions.

The acquisition device may be configured to sample, for a particular gradient setting, data during at least part of a time interval from the radio-frequency (RF) pulse to the echo time (TE), and during at least part of a time interval from the echo time (TE) onwards. This allows to efficiently acquire relevant data for the bone tissue enhancement and/or to perform the acquisition relatively quickly and enables efficient and fast data processing on single k-lines to facilitate sliding window image reconstructions.

The acquisition device may be configured to perform the sampling at sampling points, wherein at least some of the sampling points are arranged symmetrically with respect to a time point defined by the echo time (TE). This further facilitates the processing of the phase ramp. For example, the acquisition device may be configured to perform the sampling at sampling points that are substantially symmetrically distributed with respect to a time point defined by the echo time (TE).

The acquisition device may be configured to generate the MRI dataset according to a static main magnetic field strength and an echo time in a range between $T_2$ value of a bone and a water-fat in-phase time point corresponding to the static main magnetic field strength. Such an echo time is long enough to facilitate $T_2$ signal decay in bone. Moreover, such an echo time allows to sample relevant data before and after lapse of the echo time and enables efficient and fast data processing on single k-lines to facilitate sliding window image reconstructions.

The acquisition device may be configured to acquire data points in a region around a center of k-space using frequency encoding, wherein the data points are arranged along lines intersecting the center of k-space. For example, the points on each line may be sampled on a line-by-line basis, but alternative sequences are also possible. For example, the points may be sampled in a spiral order or using a rosette sampling pattern.

The combining unit may comprise a subtraction unit for performing a subtraction based on the MRI dataset generated by the acquisition device and the bone-enhanced image dataset. For example, the original MRI data (before applying the phase ramp) and the bone-enhanced image dataset (after applying the phase ramp) may be subtracted. Such subtraction enhances the differences between the two datasets. As the major difference between the two datasets is enhanced visualization of bone, such processing further enhances bone structures.

The system may comprise a first reconstruction unit for reconstructing the bone-enhanced image dataset to obtain a bone-enhanced image dataset in a spatial domain. A Fourier transform may be applied in the reconstruction process. The dataset in spatial domain facilitates visualization.

Additionally or alternatively, the system may comprise a second reconstruction unit for reconstructing the background suppressed image dataset, to obtain a reconstructed background suppressed image dataset in a spatial domain. This facilitates visualization. The first and second reconstruction unit may be the same reconstruction unit. In a particular example, the only difference between the first and second reconstruction unit is the dataset that is provided to an input of the reconstruction unit.

The phase ramp may be based on an equation $$H(k)=e^{-i2\pi \cdot f(k) \cdot x_0},$$

wherein H(k) denotes the phase ramp expressed in a complex radial frequency domain with coordinate k, k denotes the spatial frequency and $x_0$ represents a shift in image space. For example, this shift in image space is substantially equal to $n \cdot d_{pix}$, with n the number of pixels to be shifted (this parameter may be related to the cortical bone thickness) and $d_{pix}$ the size of a pixel according to the image resolution. In a particular example, the function f is the identity function: $f(k)=k$. However, this is not a limitation. For example, $f(k)$ may be any function in k in any domain of k (e.g.: $f(k)=a$ $(b \cdot k+c)^d+e$ with a, b, c, d, e constants). Preferably, f(k) is a monotonously increasing function.

The processing unit may be configured to apply H(k) with positive and negative values of k.

For example, $k=\gamma/2\pi \cdot G \cdot t$, wherein $\gamma$ is a gyromagnetic ratio, t is a time of encoding with respect to a center of k-space according to the echo time, for positive and negative values of t, and G is a read gradient. Note that G may be either constant or may be dependent on t.

According to another example, a method of bone imaging using magnetic resonance imaging is provided. The method comprises generating an echo MRI dataset according to a radial sampling scheme and an echo time greater than or equal to the $T_2$ value of bone, wherein the MRI dataset comprises complex data indicative of a chemical shift and a magnetic susceptibility; and processing the MRI dataset by applying a phase ramp to the complex data according to the radial sampling scheme, to obtain a bone-enhanced image dataset.

According to another example, a computer program product comprising computer readable instructions is provided. The instructions, when executed by a control unit, cause the control unit to control an acquisition device to generate an echo MRI dataset according to a radial sampling scheme and an echo time greater than or equal to a $T_2$ value of a bone, wherein the MRI dataset comprises complex data indicative of a chemical shift and a magnetic susceptibility; and to control a processing unit to process the MRI dataset by applying a phase ramp to the complex data according to the radial sampling scheme, to obtain a bone-enhanced image dataset.

For example, a method of bone imaging using MRI may comprise generating an echo MRI dataset according to a radial sampling scheme and an echo time greater than or equal to the $T_2$ value of bone, wherein the MRI dataset comprises complex data indicative of a chemical shift and a magnetic susceptibility; and processing the MRI dataset by applying a phase ramp to the complex data according to the radial sampling scheme, to obtain a bone-enhanced image dataset.

Figure 1A:
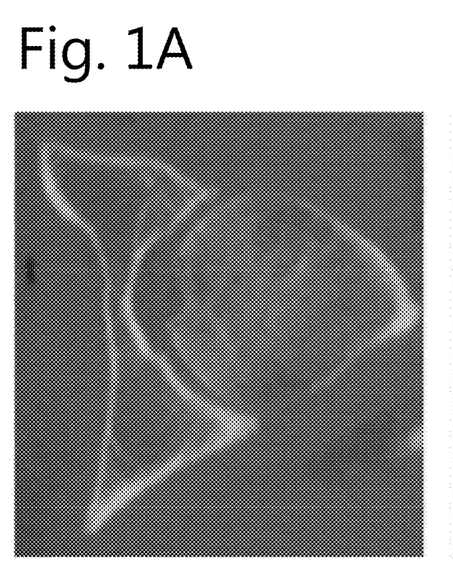
FIG. 1A is a CT image depicting cortical bone.
Figure 1B:
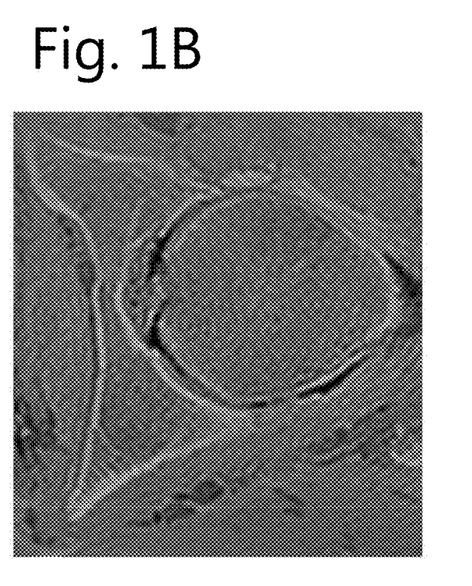
FIG. 1B is an MRI image depicting cortical bone.
Figure 2A:
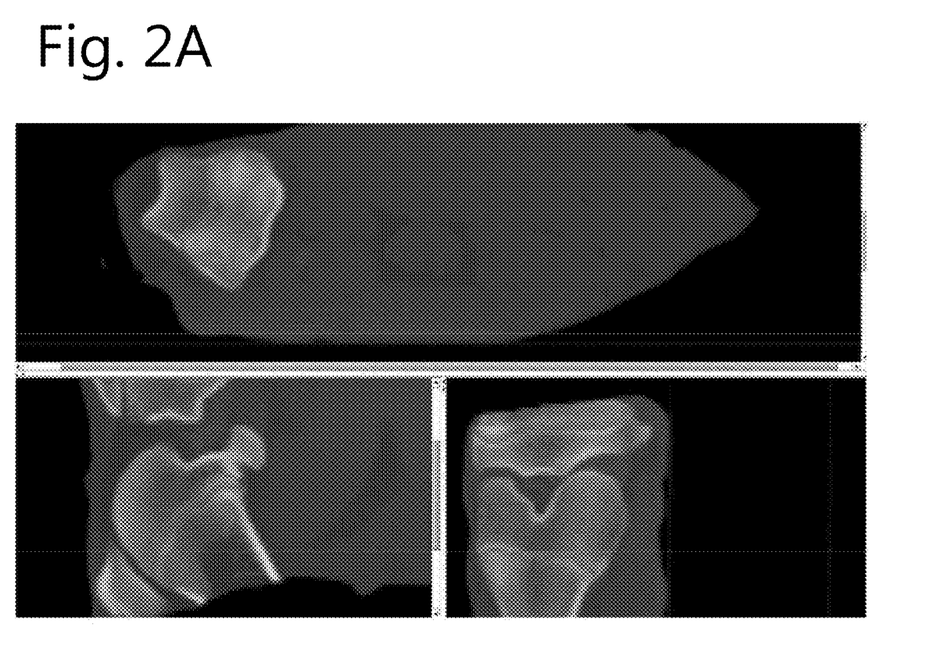
FIG. 2A shows CT images of a joint.
Figure 2B:
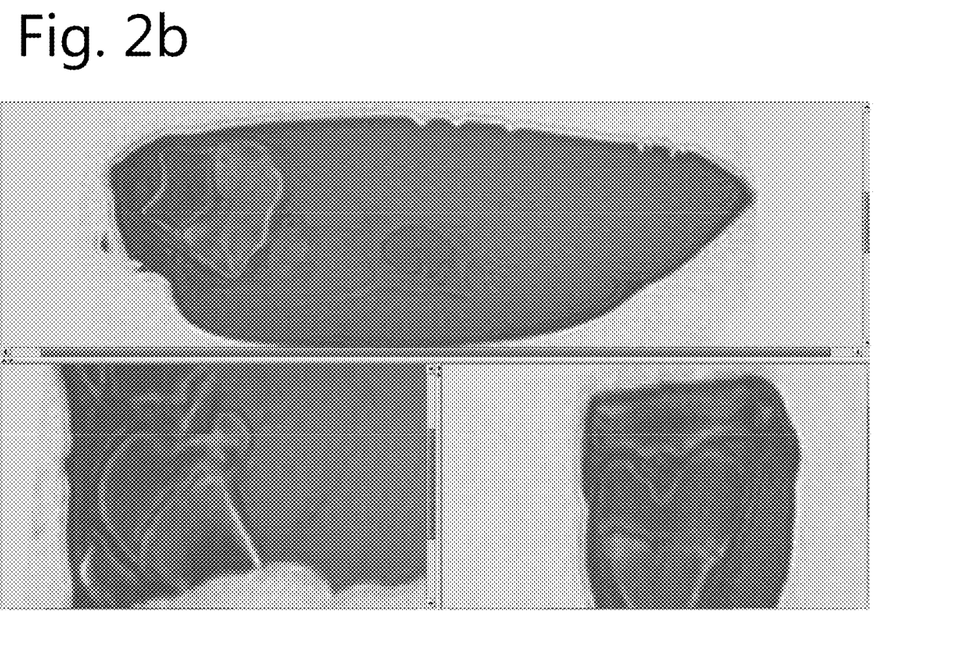
FIG. 2B shows MRI images of a joint.

FIG. 1A shows a CT image of an object comprising cortical bone. FIG. 1B shows an MRI image of the same object shown in FIG. 1A. FIG. 2A shows several orthogonal CT images of an object comprising a joint. FIG. 2B shows corresponding MRI images of the same object shown in FIG. 2A. The MRI images of FIG. 1B and FIG. 2B have been acquired and processed using the acquisition scheme and the bone enhancement and background suppression techniques presented herein. It can be seen that the bone structures that are visible in the CT images are also visible, with surprising quality, in the MRI images.

Embodiments of the invention may provide for a means of identifying different tissue types within a subject using magnetic resonance imaging. Embodiments may achieve this by using a pulse sequence which comprises commands to acquire a gradient echo MRI using a radial sampling scheme (radial frequency encoding). In the context of this document the terminology "radial sampling scheme" includes any sampling scheme that samples the center of k-space, as defined by the echo time, in a radial fashion, providing the freedom to extend in any other trajectory towards the periphery of k-space, including spiral sampling, rosette sampling etc. More particularly, the radial sampling scheme contains sampling points arranged along lines intersecting the center point of k-space. The gradient echo data may be acquired on a timescale of several milliseconds. It is possible to select a timescale for the acquisition that is relatively short, but long enough to allow the signal from cortical bone to be substantially relaxed within the defined echo time. This way, the fact that cortical bone has short $T_2$ may be exploited in the acquisition scheme. Radial frequency encoding of at least the center of k-space may be used to induce radially symmetric susceptibility and chemical shift artifacts, when present. In this context both radial and spiral sampling may be performed. In case of radial frequency encoding, off-resonance effects induced by differences in magnetic susceptibility or chemical shift may be symmetrically distributed in k-space (in the direction of each frequency-encoded k-space line), which may be favorable for accurate localization of structures and objects.

Another example of a radial sampling scheme is propeller/blade sampling.

Echo MRI is a technique that is known in the art by itself and can be implemented as, for example, spin echo MRI or gradient echo MRI. In the following description, the concepts will be explained using the example of gradient echo MRI, although the techniques disclosed herein are not limited to gradient echo MRI but can be applied using other echo MRI sequences. The echo MRI acquisition scheme comprises the application of a magnetic field gradient after the RF excitation pulse (t'=0) but prior to the echo time (TE), which induces spin dephasing, followed by the application of a second gradient, which in turn rephases the spins and subsequently generates an echo, which is why the protocol is referred to as echo MRI. By definition, the echo time coincides with the formation of the echo. As is known in the art per se, sampling the free induction decay may imply that no dephasing gradient is used prior to a rephasing gradient and signal sampling.

For example, a gradient echo acquisition may be performed utilizing a short echo time, but not an ultrashort echo time. The latter can only be obtained when sampling the free induction decay, and not when sampling a gradient echo. Short echo times related to gradient echoes and ultrashort echo time imaging related to free induction decay (FID) sampling are concepts that are known in the art. For example, such an ultrashort echo time, related to sampling of an FID is below the $T_2$ value of bone, whereas in general a short echo time related to gradient echo sampling is above the $T_2$ value of bone. Moreover, radial frequency encoding may be employed.

Possible adaptations include, but are not limited to: the use of (partial) fat suppression (spectral presaturation with inversion recovery: SPIR, spectral attenuated inversion recovery: SPAIR), selective excitation, long $T_2$ suppression, the use of a balanced acquisition scheme, and/or the incorporation of an FID or multiple echoes in the acquisition. Furthermore, analysis of phase data to investigate susceptibility using for example methods well-known in the MRI-community (quantitative susceptibility mapping (QSM), Projection onto dipole fields (PDF), sophisticated harmonic artifact reduction for phase data (SHARP) etc.) may be useful to discriminate air, other tissue types or devices from bone.

Figure 3:
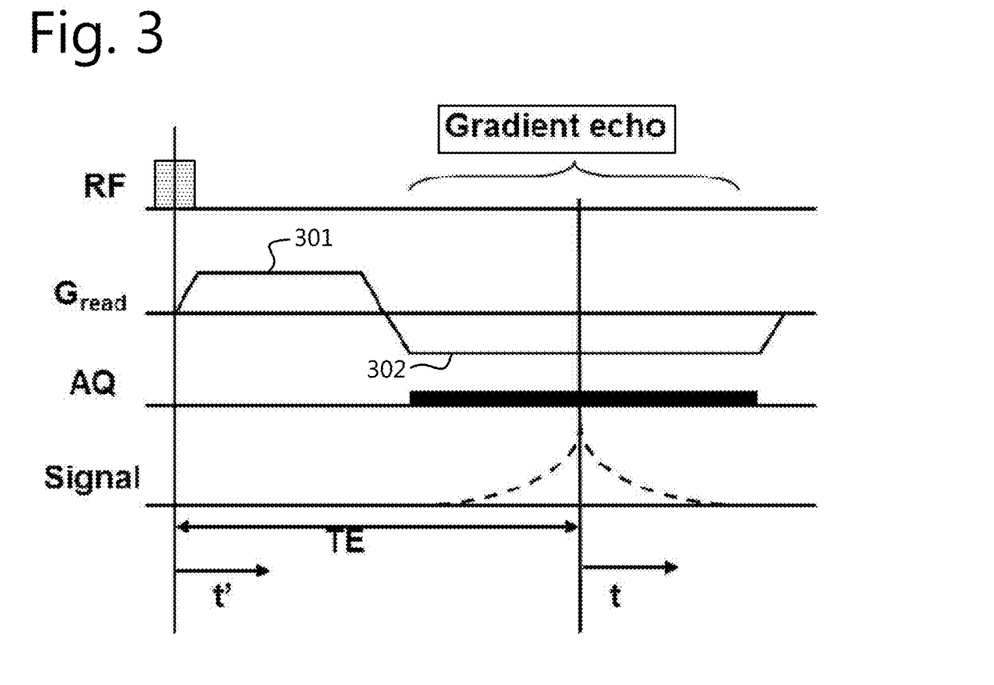
FIG. 3 is a diagram illustrating an acquisition scheme.

FIG. 3 illustrates an MRI acquisition scheme that may be used in conjunction with the embodiments described herein. In this schematic drawing only one frequency encoding axis is shown for simplicity, presented by $G_{read}$. The scheme contains a radio frequency (RF) pulse, a dephasing gradient to traverse k-space in a certain direction to arrive at the start point of the sampling interval in k-space and a rephasing gradient with opposite polarity which constitutes the read gradient (G_{read}), which is turned on just before start of the acquisition interval (AQ). A time parameter t' is zero at the time of the RF pulse. A time parameter t=t'−TE is zero at the echo time (TE). The acquisition interval (AQ) includes sampling points sampled before and after the time point that is defined by the echo time (TE), i.e., t may be positive and negative, representing for example a full gradient echo or a partial gradient echo. Therefore, the acquisition interval (AQ) extends on both sides of the echo time (TE).

The echo MRI acquisition scheme of FIG. 3 may, for example, be further described by the application of a magnetic field gradient 301 after the RF excitation pulse (t'=0) but prior to the echo time (TE), which induces spin dephasing, followed by the application of a second magnetic field gradient 302, which in turn rephases the spins and subsequently generates an echo. In case of gradient echo imaging, the second magnetic field gradient 302 has the opposite sign compared to the magnetic field gradient 301 (as illustrated in the graph of $G_{read}$, in FIG. 3). By definition, the echo time coincides with the formation of the echo, which in the case of gradient echo occurs when the total gradient area of the magnetic field gradients played out equals zero. Herein, area=$\int_0^{t'} G(t')dt'$=0, for t'=TE).

The techniques set forth herein may allow for the generation of a bone enhanced image. For example, the bone enhanced image may be generated using a phase ramp, as will be elaborated hereinafter. The techniques set forth herein may also allow for the generation of an image which selectively depicts bone structures with positive contrast. Such an image may be generated from the bone enhanced image, for example after background suppression.

Figure 4:
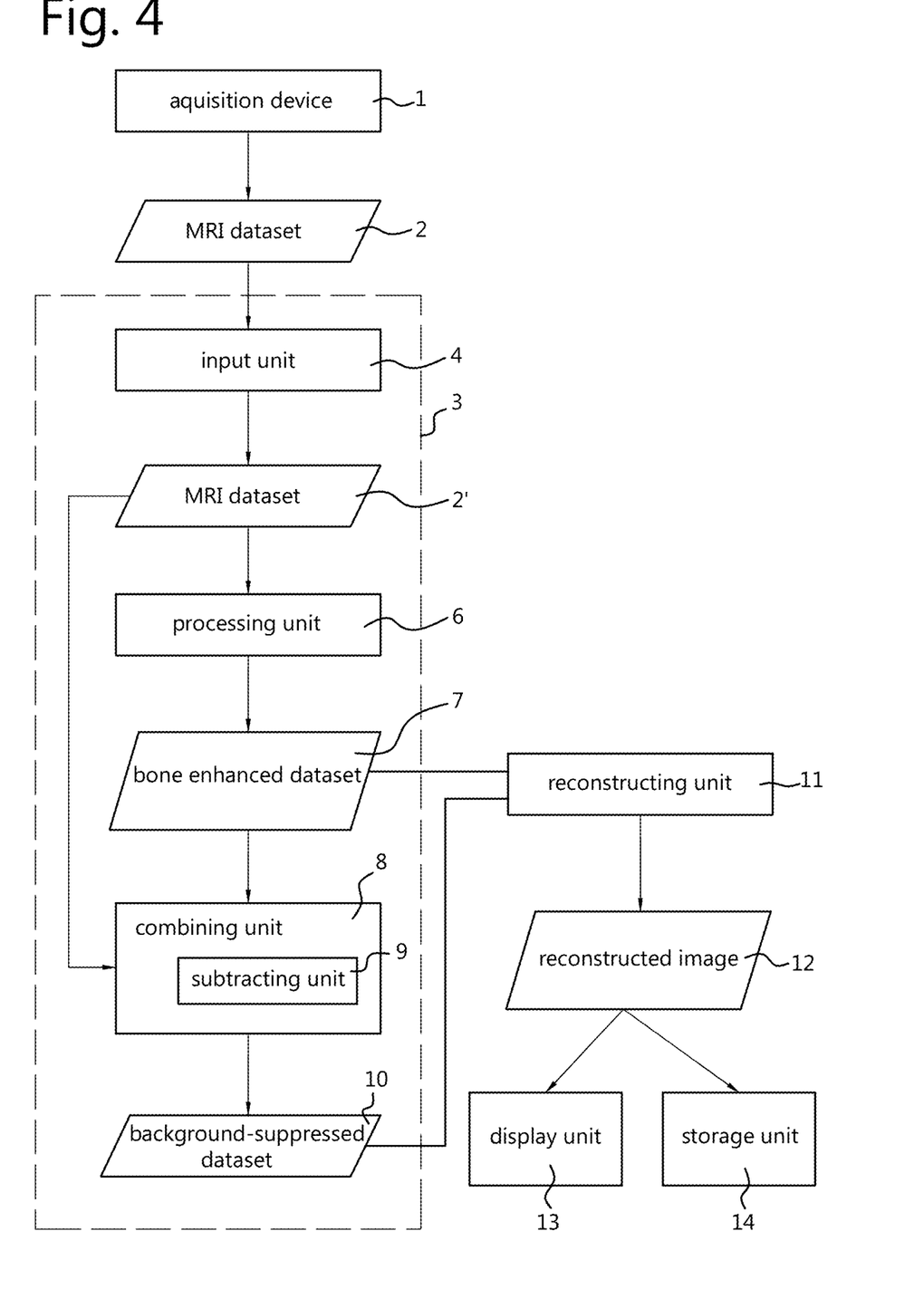
FIG. 4 is a block diagram of a system for bone imaging.

FIG. 4 shows a block diagram of a system for bone imaging using magnetic resonance imaging (MRI). The system may be implemented entirely inside an MRI imaging device. Alternatively, the processing components, which are configured to process the data generated by the imaging device, may also be implemented as standalone software or in a separate processing device, or on a workstation. The acquisition device 1 is used to acquire the MRI dataset 2. In this context, a dataset may be a single line (radial, spiral or any other shape) of k-space points obtained in a single repetition or a full dataset containing multiple lines of k-space in many directions. Examples of the acquisition scheme used for the data acquisition are provided in detail elsewhere in this disclosure. The MRI device generates an MRI dataset 2, which may be provided to an input unit 4 of an image enhancement unit 3. The image enhancement unit 3 may comprise the input unit 4, a processing unit 6, and/or a combining unit 8. However, the image enhancement unit 3 Is not limited thereto. In a particular example, the dataset may comprise of only a single radial line of k-space points obtained in a single repetition, to facilitate efficient processing and to allow sliding window reconstruction approaches. The input unit may be an internal component or software module of the MRI device, or an interface of a device that is operative to communicate with the MRI device, for example. Optionally, the input unit may be configured to perform a check to verify whether the MRI dataset was acquired according to a supported protocol, and reject the dataset if this condition is not met. The input unit 4 provides the received MRI dataset 2, 2' to the processing unit 6. This processing unit is configured to apply a phase ramp to enhance bone structures in the dataset, as explained in more detail elsewhere in this disclosure. The bone-enhanced dataset 7 resulting from the processing may optionally be provided to a reconstruction unit 11.

Optionally, the bone-enhanced dataset 7 and the original MRI dataset 2' are provided to combining unit 8. The combining unit 8 combines the two datasets 2', 7, to create a background-suppressed dataset 10. For example, the combining unit 8 performs a comparison operation, multiplication operation, or other kind of operation to enhance differences between the two datasets 2',7. For example, the combining unit subtracts the MRI dataset 2' from the bone-enhanced dataset 7 (or vice versa) by means of a subtracting unit 9. Thus, the combining unit creates a background-suppressed dataset 10. Optionally, the background-suppressed dataset is provided to the reconstruction unit 11. For example, this processing may be performed by the image enhancement unit 3 for each radial line of k-space separately. This way, processing for already acquired k-lines can start while the remaining k-lines are being acquired, facilitating real-time processing.

The reconstruction unit 11 performs a reconstruction of MRI datasets provided to it. This reconstruction may be performed in a way known in the art. The reconstruction unit 11 may be configured to perform an inverse Fourier transform to the data to transform it from a frequency domain into a spatial domain. The reconstruction unit 11 thus produces a reconstructed image dataset 12 from the inputted dataset (e.g., the original MRI dataset 2', the bone-enhanced dataset 7, or the background-suppressed dataset). Other kinds of datasets may be reconstructed by the reconstructing unit 11 as well. The reconstructing unit 11 may use different reconstruction parameters and/or different reconstruction algorithms for the different types of datasets to be processed. The reconstructed image 12 may be displayed on a display unit 13 and/or stored by a storage unit 14. The storage unit 14 may, for example, store the dataset in a healthcare information system.

Figure 5:
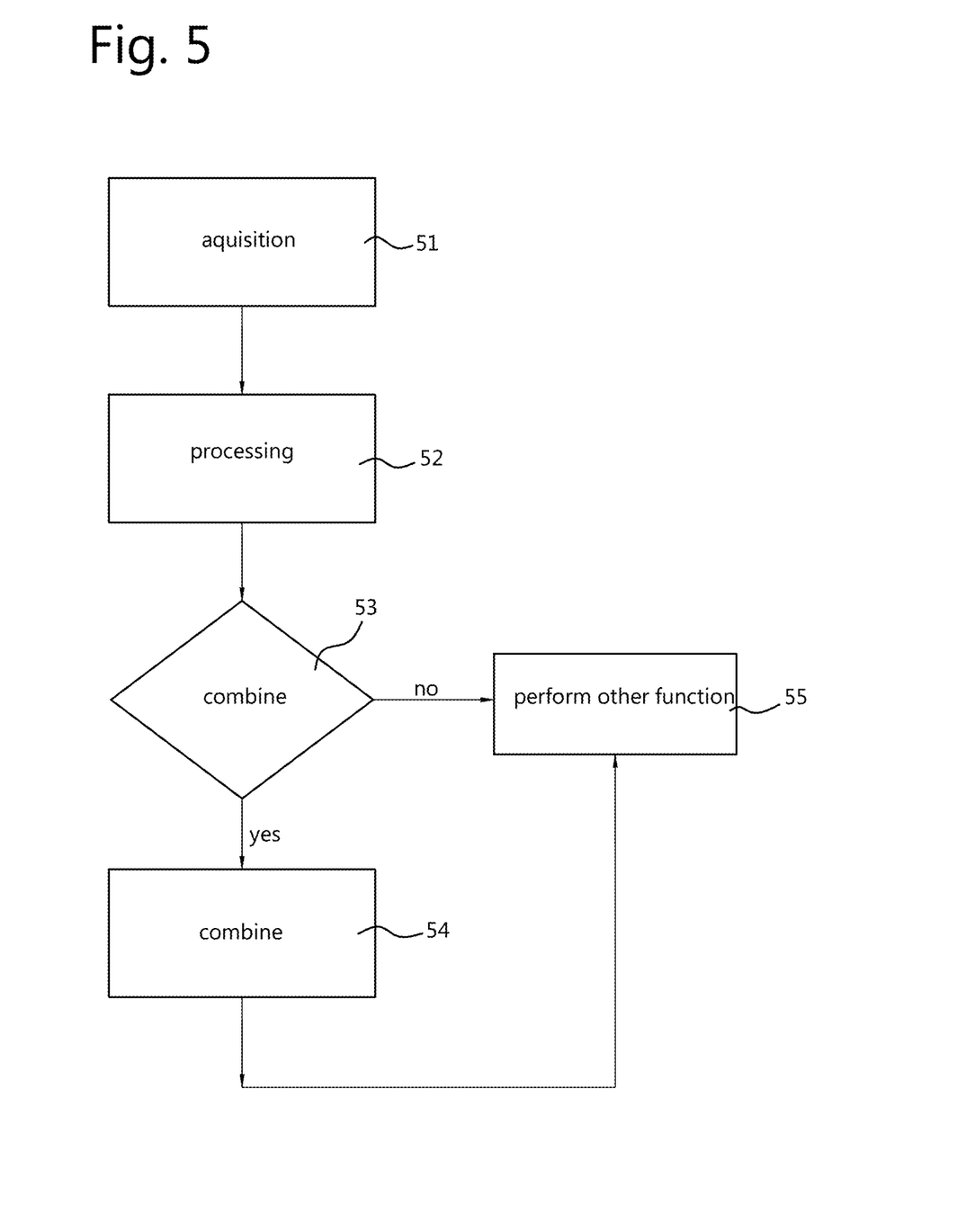
FIG. 5 is a flowchart of a method of bone imaging.

FIG. 5 shows a flowchart of a method of image processing. The method may be implemented in a computer software. In step 51, an MRI device is controlled to perform an MRI acquisition using a radial acquisition scheme. The acquired dataset is forwarded to a processing unit. The processing unit then receives the echo MRI dataset, which was acquired according to a radial sampling scheme and an echo time greater than or equal to the $T_2$ value of a bone. The MRI dataset comprises complex data indicative of a chemical shift and a magnetic susceptibility. In step 52, the processing unit processes the MRI dataset by applying a phase ramp to the complex data according to the radial sampling scheme, and thus creates a bone-enhanced image dataset. The phase ramp may be applied to positive and negative positions on a radial sampling line of the sampling scheme with respect to an origin defined by the echo time. In step 53, it is determined whether the bone-enhanced image dataset should be combined with the received MRI dataset. If not, then another function is performed in step 55, such as storing the data, and/or reconstructing and displaying the data. Either or both of the frequency-domain or reconstructed spatial-domain data may be stored.

If it is determined that the bone-enhanced image dataset should be combined with the received MRI dataset, in step 54, the bone-enhanced image dataset is combined with the received MRI dataset. Next, in step 55, another function is performed, such as storing the data, and/or reconstructing and displaying the data. Either or both of the frequency-domain or reconstructed spatial-domain data may be stored.

It is noted that the illustrated flowchart only presents a simplified flow. In an embodiment, processing steps are performed in a more complex order.

In the following, a more detailed embodiment will be described. It will be understood that the features described in these detailed embodiment are only to be understood as examples, and do not limit the scope of the invention.

In a first step, a gradient echo MRI acquisition may be performed using a radial sampling scheme with short, but not ultrashort echo time. This gradient echo may be balanced, long $T_2$ suppressed and/or fat-suppressed, but this is not a limitation. The echo may be a full echo or a partial echo.

For example, suitable acquisition types may include a 3D kooshball acquisition, a 3D radial stack-of-stars acquisition, or a 2D single slice radial acquisition. Instead of radial k-space sampling, spiral sampling may also be performed, as long as the center of k-space is sampled in a radial fashion in each profile.

The echo time (TE) is preferably not ultrashort, to enable the bone structures to be selectively depicted with low signal due to the low $T_2$ and/or $T_2^*$ relaxation parameters of bone. For example, the echo time is at least as long as the $T_2$ value of cortical bone. For example, the echo time is at most as long as the water-fat in-phase time point, which depends on the field strength of the scanner. Complex data (real and imaginary) may be saved to preserve information about both chemical shift and susceptibility. For example, the acquired data for a particular k-line is denoted by s(k) as a function of the k-coordinate.

The acquired complex MRI data s(k) may be processed. For example, each k-line may be processed separately, although this is not a limitation. A phase ramp may be applied to each k-line. For example, the acquired data s(k) may be processed per acquired read-out line (radial or spiral profile) by introducing a global translation in image space to the data by multiplying each k-line with a phase ramp. Such a global translation in image space corresponds to a linear phase ramp in k-space. Therefore, the operation can be performed in k-space or in image space, although in most cases the operation in k-space is significantly more efficient. This processing procedure is referred to herein as the 'bone-enhancement procedure'. For example, this bone-enhancement procedure may be performed prior to image reconstruction. By performing the operation in k-space, use is made of the Fourier shift theorem according to which multiplication with a linear phase in frequency domain induces a global shift in spatial domain. Using the bone-enhanced data (substantially comprising all processed k-lines), a bone-enhanced image may be constructed, named the bone-enhanced reconstructed image $S_{enh}$.

To generate an image selectively depicting bone structures, it is possible to combine S(k) with $S_{enh}$(k). One example technique that can be used to combine these datasets is by means of a subtraction operation, possibly following a normalization step. The combining operation can be performed on individual k-lines, prior to image reconstruction. However, this is not a limitation. The image resulting from this combination is called herein a background suppressed image dataset ($S_{bs}$(k)).

When the bone-enhancement procedure is applied in k-space, it is possible to apply this directly to the radial profiles (or k-lines) to build the bone-enhanced and the background suppressed (bs) images in k-space line by line:

$$s_{bs}(k)=s_{enh}(k)-C_1 \cdot s(k) \qquad \text{[Equation 1]}$$

with $$s_{enh}(k)=s(k) \cdot H(k)=s(k) \cdot e^{-i\gamma \cdot G \cdot t \cdot n \cdot d_{pix}}, \text{ (for } f(k)=k) \qquad \text{[Equation 2]}$$

wherein $k=\gamma/2\pi \cdot G \cdot t$ and $\gamma$ denotes the gyromagnetic ratio, t (t=t'−TE) denotes the time of encoding with respect to the center of k-space defined by the echo time (TE), t' denotes the time measured from the center of the RF pulse, G denotes the read gradient, n denotes the number of pixels to be shifted (this parameter may be related to the cortical bone thickness) and $d_{pix}$ denotes the size of a pixel according to the image resolution. The function f(k)=k in this example, but this may differ. Equations 1 and 2 result in a single linear phase ramp for an entire radial profile. The parameter $C_1$ may be used to control the amount of background suppression. Although this parameter may be varied, the values between and including 1 and 2 may provide good results.

It is noted that in the above equations, k denotes the k-space coordinate, and s(k) denotes the signal in k-space. A Fourier transform may be used to transform the data in k-space into a spatial image. This Fourier transform is commonly used as a reconstruction step in MRI.

The parameters G and $d_{pix}$ may be determined by the acquisition protocol. The parameter n is a parameter that may be chosen by the user, to control the bone enhancement in a certain way. This parameter may be chosen depending on the size of the cortical bone to be imaged. For example, if the bone to be enhanced is 1 pixel thick, this parameter may be set optimally to 1. In some cases, multiple reconstructions using different values for n may be combined to obtain the optimal bone enhancement. This may be the case for skull for example, where the cortical bone is much thicker than in many other bones.

Preferably, the parameter t in the exponent $-i\gamma \cdot G \cdot t \cdot n \cdot d_{pix}$ of Equation 2 is allowed to become both negative and positive, while keeping the read gradient G constant. This allows a whole k-line including both negative and positive k values to be scanned in a single repetition. This is in contrast with center-out sampling, where the parameter t is only positive. In center-out sampling, in principle two sides of the k-line may be scanned consecutively, by using two acquisitions in two separate repetitions with read gradient G values having opposite sign (or opposite direction).

Although a radial sampling scheme is described herein for clarity to explain the invention, this is not a limitation. Other ways to achieve the same or a similar result may be devised on the basis of this disclosure, using for example mathematical transformations known in the art. Such transformations may, for example, allow the acquisition to be performed using a different trajectory as long as the center of k-space is sampled in a radial fashion (e.g. spiral, rosette, blades) and virtually transformed to a radial grid to perform the described processing. Also, the phase ramp in k-space may be replaced by a Fourier transformed version of the phase ramp, so that the corresponding operation may be performed in the spatial domain. Herein, it is important to realize that the phase ramp is a non-trivially complex entity in the sense that the imaginary part of the phase ramp cannot be neglected. Background suppression by combining the bone-enhanced image with the original image by for example subtraction, may also be performed either in k-space or in spatial domain. Also this combination may even be encoded in the filter.

As alternatives to a gradient echo, other scan techniques may be used. For example, a spin echo sequence may be used.

Besides visualization of cortical bone, which may be useful for diagnostic purposes and disease detection, the method may be used to generate an image which represents a relative estimate of the electron density of the tissue. The method does not necessarily obtain MR signal from the cortical bone itself. Rather, the method exploits two tissue parameters of bone: 1) its low $T_2$ relaxation parameter, and 2) its susceptibility difference with surrounding soft tissue (such as water and fat).

For visualization of metal objects, methods have been proposed in "Highly Localized Positive Contrast of Small Paramagnetic Objects Using 3D Center-Out Radial Sampling With Off-Resonance Reception", Seevinck P R, Magn Res Med, 2011 January; 65(1):146-56. doi: 10.1002/mrm.22594; "Center-Out Radial Sampling With Off-Resonant Reconstruction for Efficient and Accurate Localization of Punctate and Elongated Paramagnetic Structures", De Leeuw H, Magn Res Med, 2013 June; 69(6):1611-22. doi: 10.1002/mrm.24416; and "A dual-plane co-RASOR technique for accurate and rapid tracking and position verification of an Ir-192 source for single fraction HDR brachytherapy", De Leeuw et al, Phys Med Biol. 2013 Nov. 7; 58(21):7829-39. doi: 10.1088/0031-9155/58/21/7829.

These methods differ from the method for bone enhancement disclosed herein. Among others, the published methods utilize center-out sampling in combination with ultrashort echo time (UTE) sampling. The method for bone-enhanced imaging, disclosed herein, samples the gradient echo on both sides of the echo time and utilizes echo times adapted to $T_2$ relaxation times of cortical bone and sampling of whole or partial k-lines (with positive and negative values of k).

Lack of the need for ultrashort echo times may reduce the needed complexity of the MR scanner, provide more flexibility in terms of contrast generation between tissue types, facilitate 2D imaging, reduce noise produced by the device, may reduce the need for extremely high encoding gradients and consequently may reduce the amount of peripheral nerve stimulation and enhance compatibility with clinical standards. Moreover, as a single acquisition suffices to generate the bone-enhanced and/or background-suppressed image, time and resources are saved.

It is noted that "Center-Out Radial Sampling With Off-Resonant Reconstruction for Efficient and Accurate Localization of Punctate and Elongated Paramagnetic Structures" by De Leeuw H, in Magnetic Resonance in Medicine, June 2013; 69(6):1611-22, doi: 10.1002/mrm.24416, discloses a method for localization of paramagnetic structures. The method and system disclosed herein differ from said prior art at least by the following. First, the imaging parameters may be optimized for the specific $T_2$ of bone tissue, whereas methods for visualization of metal objects exploit the low $T_2^*$ related to the locally induced field inhomogeneity and in general aim to have an echo time as short as possible. Second, the processing to be done to obtain a bone enhanced image differs from said prior art by the fact that a single phase ramp is applied on a k-space line extending on both sides of the origin (k=0), whereas two distinct phase ramps with opposite polarities would have been used on k-space data on a line extending on both sides of the origin of k-space in case of prior art metal visualization, which leads to different results.

The processing of the data to enable bone visualization can be performed separately on each k-line, speeding up the process, because the processing can start as soon as the first k-line has been acquired and during the acquisition of the remaining k-lines. This also facilitates real-time imaging using for example sliding window and/or compressed sensing reconstruction approaches.

The post-processing technique also enables to fine-tune the reconstruction parameters after the acquisition has been completed.

The technique also enables simultaneous depiction of bone structures, soft tissue, and metal objects such as devices. Moreover, the techniques may be used to visualize water-fat regions, and air pockets and tissue-air interfaces, e.g. at the skin. Water-fat in-phase echo times may be used to suppress water-fat regions, and fat-suppression may be used to prevent fat and water-fat interfaces to be presented with high signal in the bone-enhanced image. Other suppression techniques, known in the art, may be used to suppress any structure types as desired.

The following parameters, which can either be varied during the reconstruction process or which are related to choices made during the imaging process, may be used to control the generation of the bone-enhanced image:

Field strength, which may influence the optimal acquisition settings since field strength influences susceptibility and chemical shift related aspects.

Sampling bandwidth, which may depend on readout gradient strength and sampling density, which may be expressed in terms of water-fat shift (wfs).

geometry (e.g. thickness, orientation) of bone structures in mm and with respect to $B_0$.

magnetic susceptibility of bone (−11.3 ppm), compared to water (−9 ppm) and fat (−8.3 ppm).

The bone enhancement procedure makes use of the Fourier shift theorem. The Fourier shift theorem may be applied to each k-line crossing the center of k-space. By applying a multiplication in the frequency domain (k-space) by $\exp(-i2\pi k x_0)$, a shift in the spatial domain (image space) equal to $x_0$ can be achieved. Mathematically, convolution in spatial domain with a function $$h(x) = \delta(x - x_0)$$

corresponds to multiplication in the frequency domain with a function $$H(k) = e^{-i2\pi f(k) x_0},$$

The slope of the ramp of $H(k)$ is determined by $x_0$. The parameter $x_0$ may be related to the size of the bone (hypointensity). $H(k)$ denotes the phase ramp expressed in a complex radial frequency domain with coordinate k, k the spatial frequency and $x_0$ represents a shift in image space equal to $n \cdot d_{pix}$, with n the number of pixels to be shifted (this parameter may be related to the cortical bone thickness) and $d_{pix}$ the size of a pixel according to the image resolution. In general the function $f(k) = k$, but alternatively $f(k)$ may be any function in k in any domain of k (e.g. $f(k) = a(b \cdot k + c)^d + e$ with a, b, c, d, e constants).

The processing unit may be configured to apply $H(k)$ with positive and negative values of k.

By definition, the equation $k = \gamma / 2\pi \cdot G \cdot t$ may hold, wherein $\gamma$ is a gyromagnetic ratio, t is a time of encoding with respect to a center of k-space according to the echo time, for positive and negative values of t, and G is a read gradient. Note that G is constant in this example, but in practice may be dependent on t.

In an embodiment the method is applied in 2D or 3D directly. Instead of in 1D for each k-line separately, the method can be applied in one transformation for a complete 2D image or 3D dataset. For this, a 2D or 3D complex filter can be made, incorporating the effect of a series of 1D phase ramps in k-space. In another embodiment this is done in image domain, by convolving the complex image data with a 2D or 3D complex filter obtained by Fourier transforming the complex 2D or 3D k-space filter.

When acquiring the echo MRI dataset, the echo time (TE) may be selected greater than the $T_2$ of the bone that is to be visualized, because the signal of that bone has largely disappeared by then. That is, for TE≈$T_2$, $e^{-TE/T2} \approx e^{-1} \approx 0.37$. In case of cortical bone, the echo time may be selected greater than a $T_2$ value that occurs in the cortical bone to be visualized, for example this $T_2$ time can be 0.2 milliseconds, and the echo time is then selected greater than 0.2 milliseconds.

Figure 6:
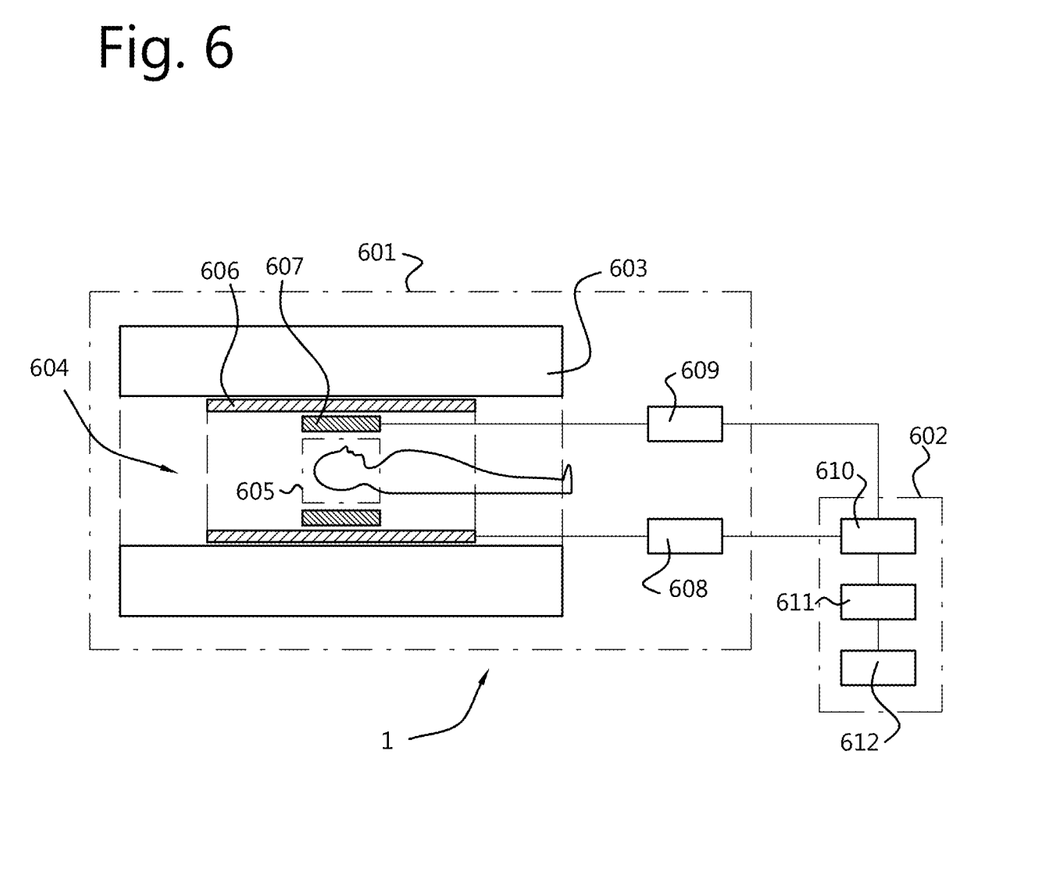
FIG. 6 shows a block diagram of an acquisition device.

FIG. 6 illustrates an example of the acquisition device 1. The acquisition device may comprise a magnetic resonance imaging system 601, and a computer system 602. The magnetic resonance imaging system 601 has a magnet 603. Illustrated is a cylindrical magnet, although other shapes, such as open magnets, can also be used as known in the art per se. The magnet can be a superconducting magnet, for example a magnet with a liquid helium cooled cryostat with superconducting coils. Alternatively, permanent or resistive magnets can be used. Inside the bore 604 of the cylindrical magnet 603 is an imaging region 605. The magnetic field generated by the magnet 603 inside the imaging region 605 is strong enough and sufficiently uniform to allow magnetic resonance imaging to be performed.

The magnetic resonance imaging system 601 also comprises a magnetic field gradient coil 606, shown inside the bore 604 of the magnet 603. The gradient coil 606 is used to facilitate spatial encoding, which enables the acquisition of spatially dependent magnetic resonance imaging data. The gradient coil 606 allows to spatially encode magnetic spins within the imaging region 605 of the magnet 603. The gradient coil 606 is controlled by a power supply 608. The gradient coil 606 may comprise separate sets of coils to spatially encode in three orthogonal spatial directions (not illustrated). The power supply 608 provides a current to the magnetic field coils and may be controlled to provide specific current as a function of time according to a particular acquisition sequence.

The magnetic resonance imaging system further comprises a transmit/receive coil 607, which may have an antenna function. The transmit/receive coil 607 is configured to influence the orientations of magnetic spins inside the imaging region 605 by emitting radio-frequency (RF) pulses. The transmit/receive coil 607 also receives radio signals generated by spins inside the imaging region 605. The transmit/receive coil 607 can optionally contain a plurality of coil elements (not shown). The transmit/receive coil 607 is connected to an RF transceiver 609. Alternatively, separate receiver and transmitter may be provided. Also, in alternative implementations separate transmit coil and receive coil may be provided.

The magnetic field gradient coil power supply 608 and the transceiver 609 are connected to an interface 610 of the computer system 602. The computer system 602 also comprises a processor 611. A processor can be implemented for example by means of an integrated circuit using semiconductor technology, as known in the art per se. Alternative implementations of a processor can also be employed. The processor 611 is connected to a memory 612. Memory 612 may be implemented using any available computer memory technology, such as semiconductor technology, volatile memory, non-volatile memory, magnetic storage media, or a combination thereof. The memory 612 may contain a representation of a pulse sequence (for example a pulse sequence as illustrated in FIG. 3) that can be used to control the magnetic resonance imaging system 601, in particular the gradient coil 606 through power supply 608, and the transmit/receive coil 607 through transceiver 609. The memory is also configured to store one or more MRI datasets, in particular echo MRI datasets. In general, the processor 610 is configured to store signals received from the transmit/receive coil through the transceiver 609 and the interface 610 in the memory 612.

The memory 612 also contains computer-executable instructions to control the operation of the acquisition device 1. First, the memory 612 contains an acquisition module to control the operation of the magnetic resonance imaging system 601 and storage of the received data in the memory 612.

Referring to FIG. 4, in a particular implementation the memory 612 may also contain instructions to cause the processor 611 to perform the functions of the processing unit 6, the combining unit 8, and/or the reconstructing unit 11. Further, the memory 612 may be configured to store the MRI dataset 2 and/or 2', the bone enhanced dataset 7, the background-suppressed dataset 10, and/or the reconstructed image 12. It will be understood that the processing units for processing the data do not have to be implemented in the same computer system 602. At any stage of the data processing, the data can be transmitted to another computer system (not illustrated), using for example known network technology, and the remaining processing steps can be performed on the other computer system. To that end, the other computer system may have a processor and a memory similar to the ones described above, and the memory may store the instructions of the relevant unit or units (6, 8, 12). Moreover, an input unit may be implemented on the other computer system to control to receive and store the data from the computer system 602. This way, enhancement unit 3 may be implemented on a separate computer system, for example.

Referring to FIGS. 4 and 5, it is noted that, in a particular practical implementation, the relevant value of $x_0$ may be in the range of −1 cm to +1 cm.

Referring again to FIGS. 4 and 5, it is noted that, in a particular practical implementation, the relevant value of TE may be selected greater than 0.2 or 0.3 milliseconds. Herein, 0.2 milliseconds or 0.3 milliseconds can be regarded as a representative value of the T2 of cortical bone. For example, the value of TE may be selected smaller or equal to the water-fat in-phase time point corresponding to the static main magnetic field. For example, as is known in the art by itself, this in-phase time point can be about 2.3 milliseconds at a main magnetic field of 3 Tesla, and can be about 4.6 milliseconds at a main magnetic field of 1.5 Tesla.

Some aspects are described hereinafter in form of clauses.

Clause 1. A system for bone imaging using magnetic resonance imaging, comprising an input unit for receiving an echo MRI dataset according to a radial sampling scheme and an echo time greater than or equal to a T2 value of a bone, wherein the MRI dataset comprises complex data indicative of a chemical shift and a magnetic susceptibility; and a processing unit for processing the MRI dataset by applying a phase ramp to the complex data according to the radial sampling scheme, to obtain a bone-enhanced image dataset, wherein the phase ramp is applied to positive and negative positions on a radial sampling line of the sampling scheme with respect to an origin defined by the echo time.

Clause 2. The system of clause 1, further comprising a combining unit for combining the generated MRI dataset with the bone-enhanced image dataset to obtain a background suppressed image dataset.

Clause 3. The system of clause 1, further comprising an acquisition device for generating the echo MRI dataset according to the radial sampling scheme and the echo time greater than or equal to the T2 value of the cortical bone, wherein the MRI dataset comprises complex data indicative of a chemical shift and a magnetic susceptibility.

Clause 4. The system of clause 3, wherein the acquisition device is configured to sample, for a particular encoding gradient setting, data on both sides of an origin of k-space based on the echo time (TE).

Clause 5. The system of clause 3, wherein the acquisition device is configured to sample, for a particular encoding gradient setting, data during at least part of a time interval from the radio-frequency (RF) pulse to the echo time (TE), and during at least part of a time interval from the echo time (TE) onwards.

Clause 6. The system of clause 5, wherein the acquisition device is configured to perform the sampling at sampling points, wherein at least some of the sampling points are arranged symmetrically with respect to a time point defined by the echo time (TE).

Clause 7. The system of clause 3, wherein the acquisition device is configured to generate the MRI dataset according to a static main magnetic field strength and an echo time greater than or equal to a T2 value of bone and smaller or equal to the water-fat in phase time point corresponding to the static main magnetic field.

Clause 8. The system of clause 3, wherein the acquisition device is configured to acquire data points in a region around a center of k-space using frequency encoding, wherein the data points are arranged along lines intersecting the center of k-space.

Clause 9. The system of clause 2, wherein the combining unit comprises a subtraction unit for performing a subtraction based on the generated MRI dataset and the bone-enhanced image dataset.

Clause 10. The system of clause 1, further comprising a reconstruction unit for reconstructing the bone-enhanced image dataset to obtain a bone-enhanced image dataset in a spatial domain.

Clause 11. The system of clause 2 or 9, further comprising a reconstruction unit for reconstructing the background suppressed image dataset to obtain a reconstructed background suppressed image dataset in a spatial domain.

Clause 12. The system of clause 1, wherein the phase ramp is based on an equation $$H(k)=e^{-i2\pi f(k)x_0},$$

wherein H(k) is the phase ramp expressed in a complex radial frequency domain with coordinate k, and $x_0$ represents a shift in image space, and f(k) is a monotonuously increasing function of k;

wherein the processing unit is configured to apply H(k) with positive and negative values of k.

Clause 13. The system of clause 12, wherein $k=\gamma/2\pi G \cdot t$, wherein $\gamma$ is a gyromagnetic ratio, t is a time of encoding with respect to a center of k-space according to the echo time, for positive and negative values of t, and G is a read gradient.

Clause 14. A method of bone imaging using magnetic resonance imaging, comprising receiving an echo MRI dataset according to a radial sampling scheme and an echo time greater than or equal to a T2 value of a bone, wherein the MRI dataset comprises complex data indicative of a chemical shift and a magnetic susceptibility; and processing the MRI dataset by applying a phase ramp to the complex data according to the radial sampling scheme, to obtain a bone-enhanced image dataset, wherein the phase ramp is applied to positive and negative positions on a radial sampling line of the sampling scheme with respect to an origin defined by the echo time.

Clause 15. A computer program product comprising computer readable instructions for causing a computer system to perform the method according to clause 14.

Some or all aspects of the invention may be suitable for being implemented in form of software, in particular a computer program product. Such computer program product may comprise a storage media, such as a memory, on which the software is stored. Also, the computer program may be represented by a signal, such as an optic signal or an electro-magnetic signal, carried by a transmission medium such as an optic fiber cable or the air. The computer program may partly or entirely have the form of source code, object code, or pseudo code, suitable for being executed by a computer system. For example, the code may be directly executable by one or more processors.

The examples and embodiments described herein serve to illustrate rather than limit the invention. The person skilled in the art will be able to design alternative embodiments without departing from the scope of the claims. Reference signs placed in parentheses in the claims shall not be interpreted to limit the scope of the claims. Items described as separate entities in the claims or the description may be implemented as a single hardware or software item combining the features of the items described.

The invention claimed is:

1. A system for bone imaging of a cortical bone using magnetic resonance imaging, comprising an acquisition device for generating an echo MRI dataset comprising complex data, wherein the acquisition device is configured to generate the echo MRI dataset according to a static magnetic field strength, according to a single echo time (TE) associated with an echo, and according to a radial sampling scheme wherein at least a center of a k-space is sampled in a radial fashion by carrying out an MRI acquisition scheme comprising an application of a radio-frequency pulse (RF), followed by an application of a magnetic field gradient inducing spin dephasing, followed by an application of a second magnetic field gradient inducing spin rephasing, subsequently generating the echo, wherein the acquisition device is configured to generate the echo MRI dataset by sampling during the application of the second magnetic field gradient, data on both sides of an origin of the k-space, wherein the origin of the k-space is based on the single echo time (TE), wherein the single echo time (TE) is greater than or equal to a predetermined $T_2$ relaxation time of the cortical bone and smaller than or equal to a water-fat in-phase time point corresponding to the static main magnetic field, to thereby generate the echo MRI dataset by sampling, for a particular encoding gradient setting, data during a first time interval between the predetermined $T_2$ relaxation time of the cortical bone after the application of the radio-frequency pulse (RF) and the single echo time (TE), and a second time interval from the single echo time (TE) onwards, and without sampling before the predetermined T2 relaxation time of the cortical bone after the application of the radio-frequency pulse (RF); and a processing unit for processing the MRI dataset sampled during the first time interval and the second time interval, wherein the processing unit is configured to generate a cortical bone-enhanced image dataset for bone imaging of the cortical bone from the data sampled during the first time interval and the second time interval, without using data sampled before the predetermined $T_2$ relaxation time of the cortical bone after the application of the radio-frequency pulse (RF), by applying a phase ramp to the radial sampling lines of the MRI dataset sampled, during the first time interval and the second time interval, according to the radial sampling scheme, wherein a single phase ramp is applied to a radial sampling line of the radial sampling scheme, which radial sampling line extends on both sides of an origin of the k-space defined by the single echo time, and wherein the phase ramp is based on an equation $$H(k)=e^{-i2\pi f(k)x_0},$$

wherein H(k) is the phase ramp expressed in a complex radial frequency domain with coordinate k, k denoting a spatial frequency, and $x_0$ represents a shift in image space associated with the k-space and wherein $x_0$ is related to a thickness of the cortical bone, and f(k) is a monotonically increasing function of k, wherein the processing unit is configured to apply H(k) with positive and negative values of k.

2. The system of claim 1, further comprising
a combining unit for combining the MRI dataset with the cortical bone-enhanced image dataset to obtain a background suppressed image dataset.

3. The system of claim 2, wherein the combining unit comprises a subtraction unit for performing a subtraction based on the MRI dataset and the cortical bone-enhanced image dataset.

4. The system of claim 2, further comprising a reconstruction unit for reconstructing the background suppressed image dataset to obtain a reconstructed background suppressed image dataset in a spatial domain.

5. The system of claim 3, further comprising a reconstruction unit for reconstructing the background suppressed image dataset to obtain a reconstructed background suppressed image dataset in a spatial domain.

6. The system of claim 1, wherein the acquisition device is configured to perform the sampling at sampling points, wherein at least some of the sampling points are arranged symmetrically with respect to a time point defined by the single echo time (TE).

7. The system of claim 1, wherein the acquisition device is configured to acquire data points in a region around a center of the k-space using frequency encoding, wherein the data points are arranged along lines intersecting the center of the k-space.

8. The system of claim 1, further comprising a reconstruction unit for reconstructing the cortical bone-enhanced image dataset to obtain a cortical bone-enhanced image dataset in a spatial domain.

9. The system of claim 1, wherein $k=\gamma/2\pi \cdot G \cdot t$, wherein $\gamma$ is a gyromagnetic ratio, t is a time of encoding with respect to a center of the k-space according to the single echo time, for positive and negative values of t, and G is a read gradient.

10. The system of claim 1, wherein the single echo time (TE) is larger than or equal to 0.2 miliseconds.

11. The system of claim 1, wherein acquisition device is configured to scan the radial sampling line on both sides of the origin of the k-space in a single repetition.

12. The system of claim 1, wherein the processing unit is configured to apply the phase ramp line by line to the radial sampling lines.

13. A method of bone imaging of a cortical bone using magnetic resonance imaging, comprising
generating an echo MRI dataset comprising complex data, wherein the echo MRI dataset is generated according to a static magnetic field strength, according to a single echo time (TE) associated with an echo, and according to a radial sampling scheme wherein at least a center of a k-space is sampled in a radial fashion by carrying out an MRI acquisition scheme, comprising an application of a radio-frequency pulse (RF), followed by an application of a magnetic field gradient inducing spin dephasing, followed by an application of a second magnetic field gradient inducing spin rephasing, subsequently generating the echo,
wherein the echo MRI dataset is generated by sampling, during the application of the second magnetic field gradient, data on both sides of an origin of the k-space, wherein the origin of the k-space is based on the single echo time (TE), wherein the single echo time (TE) is greater than or equal to a predetermined $T_2$ relaxation time of the cortical bone and smaller than or equal to a water-fat in-phase time point corresponding to the static main magnetic field, to thereby generate the echo MRI dataset by sampling, for a particular encoding gradient setting, data during a first time interval between the predetermined $T_2$ relaxation time of the cortical bone after the application of the radio-frequency pulse (RF) and a second time interval from the single echo time (TE) onwards, and without sampling before the predetermined T2 relaxation time of the cortical bone after the application of the radio-frequency pulse (RF); and
processing the MRI dataset sampled during the first time interval and the second time interval, wherein the processing comprises generating a cortical bone-enhanced image dataset for bone imaging of the cortical bone from the data sampled during the first time interval and the second time interval, without using data sampled before the predetermined $T_2$ relaxation time of the cortical bone after the application of the radio-frequency pulse (RF), by applying a phase ramp to the radial sampling lines of the MRI dataset sampled, during the first time interval and the second time interval according to the radial sampling scheme, wherein a single phase ramp is applied to a radial sampling line of the radial sampling scheme, which radial sampling line extends on both sides of an origin of the k-space defined by the single echo time, and wherein the phase ramp is based on an equation $$H(k)=e^{-i2\pi f(k)x_0},$$

wherein H(k) is the phase ramp expressed in a complex radial frequency domain with coordinate k, k denoting a spatial frequency, and $x_0$ represents a shift in image space associated with the k-space, and wherein $x_0$ is related to a thickness of the cortical bone, and f(k) is a monotonically increasing function of k; wherein H(k) is applied with positive and negative values of k.

14. A non-transitory computer-readable medium for bone imaging using magnetic resonance imaging, the medium comprising computer readable instructions for causing a computer system to perform the method according to claim 13.

* * * * *